United States Patent
Haroun et al.

(10) Patent No.: US 11,415,643 B2
(45) Date of Patent: Aug. 16, 2022

(54) AMPLIFICATION USING AMBIPOLAR HALL EFFECT IN GRAPHENE

(71) Applicant: TEXAS INSTRUMENTS INCORPORATED, Dallas, TX (US)

(72) Inventors: Baher S. Haroun, Allen, TX (US); Arup Polley, Richardson, TX (US); Srinath M. Ramaswamy, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 326 days.

(21) Appl. No.: 16/657,281

(22) Filed: Oct. 18, 2019

(65) Prior Publication Data

US 2020/0182950 A1 Jun. 11, 2020

Related U.S. Application Data

(60) Provisional application No. 62/776,023, filed on Dec. 6, 2018.

(51) Int. Cl.
  *G01R 33/07* (2006.01)
  *H01L 43/04* (2006.01)
  *H01L 43/06* (2006.01)

(52) U.S. Cl.
  CPC ............. *G01R 33/07* (2013.01); *H01L 43/04* (2013.01); *H01L 43/065* (2013.01)

(58) Field of Classification Search
  CPC ....... G01R 33/07; G01R 15/202; H01L 43/04; H01L 43/065
  See application file for complete search history.

(56) References Cited

U.S. PATENT DOCUMENTS

| 3,448,353 A | 6/1969 | Gallagher et al. |
| 5,307,072 A | 4/1994 | Jones, Jr. |

(Continued)

FOREIGN PATENT DOCUMENTS

WO 2013009961 1/2013

OTHER PUBLICATIONS

International Search Report for PCT/US2016/050414, dated Dec. 15, 2016 (2 pages).

(Continued)

*Primary Examiner* — Dominic E Hawkins
(74) *Attorney, Agent, or Firm* — John R. Pessetto; Charles A. Brill; Frank D. Cimino

(57) ABSTRACT

An amplifier includes a graphene Hall sensor (GHS). The GHS includes a graphene layer formed above a substrate, a dielectric structure formed above a channel portion of the graphene layer, and a conductive gate structure formed above at least a portion of the dielectric structure above the channel portion of the graphene layer for applying a gate voltage. The GHS also includes first and second conductive excitation contact structures coupled with corresponding first and second excitation portions of the graphene layer for applying at least one of the following to the channel portion of the graphene layer: a bias voltage; and a bias current. The GHS further includes first and second conductive sense contact structures coupled with corresponding first and second sense portions of the graphene layer. The amplifier also includes a current sense amplifier (CSA) coupled to the GHS. The CSA senses current output from the GHS.

15 Claims, 3 Drawing Sheets

(56) References Cited

U.S. PATENT DOCUMENTS

| | | |
|---|---|---|
| 6,529,845 B1 | 3/2003 | Beck, II |
| 7,049,812 B2 | 5/2006 | Hara et al. |
| 7,358,880 B1 | 4/2008 | Melanson |
| 10,001,529 B2 * | 6/2018 | Polley ................. G01R 33/0041 |
| 10,069,065 B2 * | 9/2018 | Polley ................... G01R 33/07 |
| 2005/0067629 A1 | 3/2005 | Woodall et al. |
| 2007/0046287 A1 | 3/2007 | Vervaeke et al. |
| 2009/0137066 A1 | 5/2009 | Imai et al. |
| 2009/0140801 A1 | 6/2009 | Ozylimaz et al. |
| 2009/0198351 A1 | 8/2009 | Kitagawa |
| 2010/0117855 A1 | 5/2010 | Sinclair et al. |
| 2011/0175628 A1 | 7/2011 | Kohlstedt |
| 2012/0025817 A1 | 2/2012 | Romero et al. |
| 2014/0008611 A1 | 1/2014 | Geim et al. |
| 2014/0197459 A1 | 7/2014 | Kis et al. |
| 2015/0102807 A1 | 4/2015 | Eckinger et al. |
| 2016/0293834 A1 * | 10/2016 | Polley ................... G01R 33/07 |
| 2017/0067970 A1 * | 3/2017 | Polley ................ G01R 33/0029 |
| 2017/0108362 A1 * | 4/2017 | Engel ................... G01R 33/072 |

OTHER PUBLICATIONS

"Hall Effect," Wikipedia available at https://em.wikipedia.org/wiki/Hall_effect on Oct. 13, 2015, pp. 1-10.

"Sensor Signal Conditioning IC for Closed-Loop Magnetic Current Sensors," DRV411, SB0S693B, Texas Instruments Incorporated, Aug. 2013, revised Dec. 2013, pp. 1-34.

Wenjun Liu, et al. "A Study on Graphene-Metal Contact," Journal, Mar. 18, 2013, Crystals 2013, 3, pp. 257-274.

Katsnelson, et al. "Chiral Tunneling and the Klein Paradox in Graphene," Nature Physics 2, 620-625 (2006).

\* cited by examiner

AMPLIFICATION USING AMBIPOLAR HALL EFFECT IN GRAPHENE

RELATED APPLICATIONS

This application claims priority to U.S. Provisional Application No. 62/776,023, filed Dec. 6, 2018, which is hereby incorporated by reference.

BACKGROUND

Hall effect sensors ("Hall sensors") are used in magnetometers, current sensors and other applications for sensing or detecting magnetic fields. Many Hall sensors employ silicon-based material for transformation of a magnetic field signal into an electrical signal based on galvanomagnetic effects caused by force applied to carriers within the semiconductor material. Graphene Hall sensors (GHS's) have been proposed to provide high magnetic field sensitivity. However, Hall sensors, including GHS's, have not been employed in amplification applications.

SUMMARY

In at least one example, an amplifier includes a GHS. The GHS includes a graphene layer formed above a substrate, a dielectric structure formed above a channel portion of the graphene layer, and a conductive gate structure formed above at least a portion of the dielectric structure above the channel portion of the graphene layer for applying a gate voltage. The GHS also includes first and second conductive excitation contact structures coupled with corresponding first and second excitation portions of the graphene layer for applying at least one of the following to the channel portion of the graphene layer: a bias voltage; and a bias current. The GHS further includes first and second conductive sense contact structures coupled with corresponding first and second sense portions of the graphene layer. The amplifier also includes a current sense amplifier (CSA) coupled to the GHS. The CSA senses current output from the GHS. An output of the CSA corresponds to an amplification of the applied gate voltage.

In another example, a method includes employing a GHS. The GHS includes a graphene layer formed above a substrate, a dielectric structure formed above a channel portion of the graphene layer, and a conductive gate structure formed above at least a portion of the dielectric structure above the channel portion of the graphene layer. The GHS also includes first and second conductive excitation contact structures coupled with corresponding first and second excitation portions of the graphene layer. The GHS further includes first and second conductive sense contact structures coupled with corresponding first and second sense portions of the graphene layer. The method also includes applying a gate voltage to the conductive gate structure, applying at least one of a bias voltage and a bias current to the channel portion of the graphene layer via the first and second conductive excitation contact structures, and sensing current output from the GHS using a CSA coupled to the GHS. An output of the CSA corresponds to an amplification of the applied gate voltage.

In yet another example, a method includes applying a gate voltage to a conductive gate structure of a GHS. The GHS includes a graphene layer and a dielectric structure formed above a channel portion of the graphene layer. The conductive gate structure is formed above at least a portion of the dielectric structure above the channel portion of the graphene layer. The GHS also includes first and second conductive excitation contact structures coupled with corresponding first and second excitation portions of the graphene layer. The GHS further includes first and second conductive sense contact structures coupled with corresponding first and second sense portions of the graphene layer. The method also includes applying at least one of a bias voltage and a bias current to the channel portion of the graphene layer via the first and second conductive excitation contact structures, applying a bias magnetic field to the GHS, and sensing current output from the GHS using a CSA coupled to the GHS, wherein an output of the CSA corresponds to an amplification of the applied gate voltage.

BRIEF DESCRIPTION OF THE DRAWINGS

For a detailed description of various examples, reference will now be made to the accompanying drawings in which.

DETAILED DESCRIPTION

An aspect of this description is to provide amplification using ambipolar Hall effect in graphene. More specifically, this technique employs a electrical signal amplification using Hall effect and gate voltage-controlled ambipolar conduction in graphene.

A graphene field effect device demonstrates ambipolar (electron or hole) carrier conduction that can be controlled by the gate voltage. As a result, Hall effect sensitivity in a graphene device shows a unique and unexpected symmetrical and proportional response with respect to the gate voltage. Specifically, the sensitivity with respect to the gate voltage around the Dirac point is linear with a slope that depends on carrier mobility. Therefore, under a constant bias magnetic field, the Hall voltage output exhibits a linear relationship with respect to the gate control voltage input. The amplification, i.e., the slope of the linear response, depends on the magnitude of the bias field. Thus, electrical amplification of the signal at the input gate voltage is achieved with a Hall effect output which is parametrically controlled by the bias magnetic field. This solution enables a separate control for amplification gain that is proportional to the bias magnetic field. Therefore, the high mobility of graphene and separate gain control provide significant advantages in wide bandwidth amplifier design.

Figure 1A:
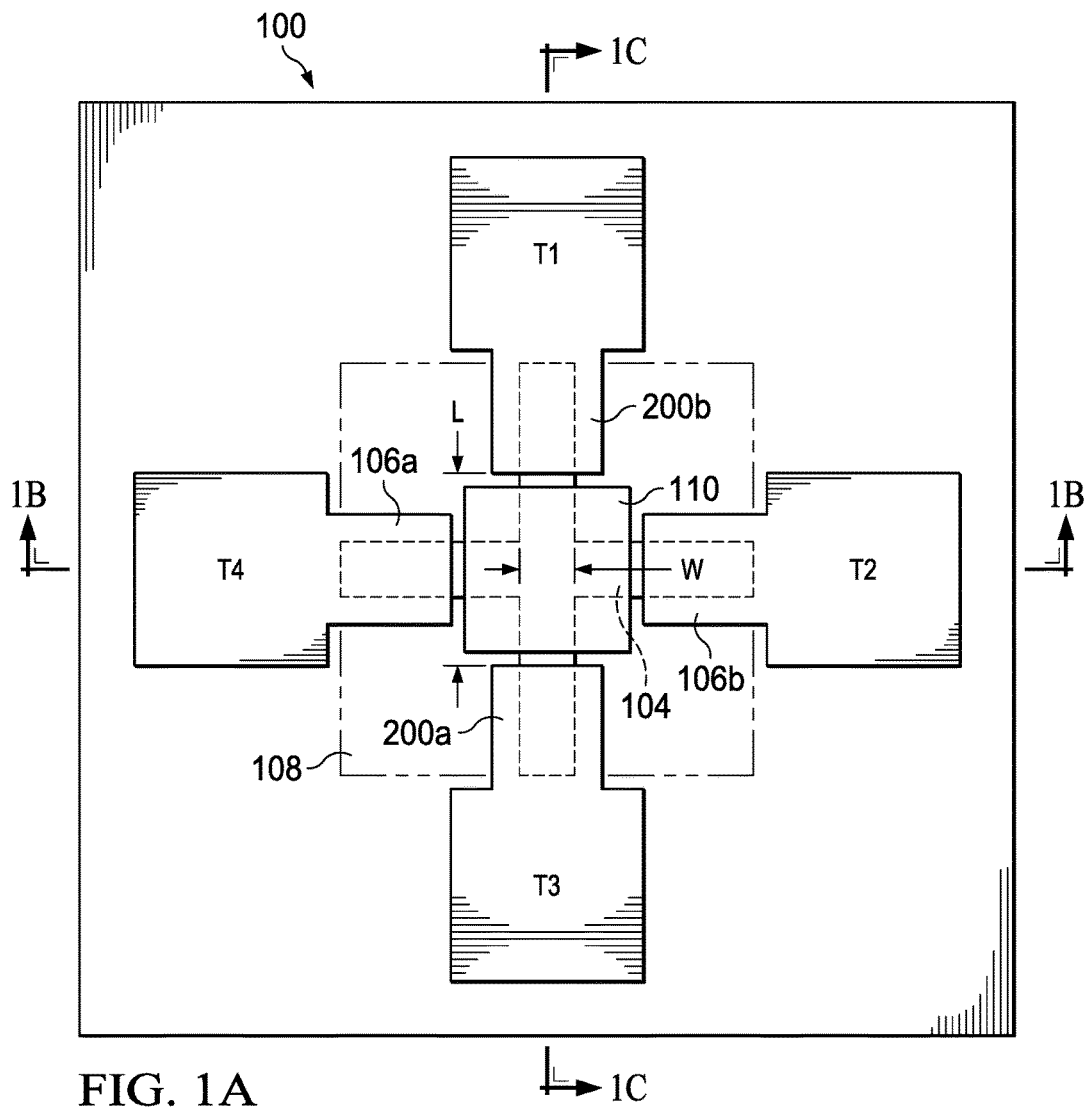
FIG. 1A is a schematic top view of a GHS.
Figure 1B:
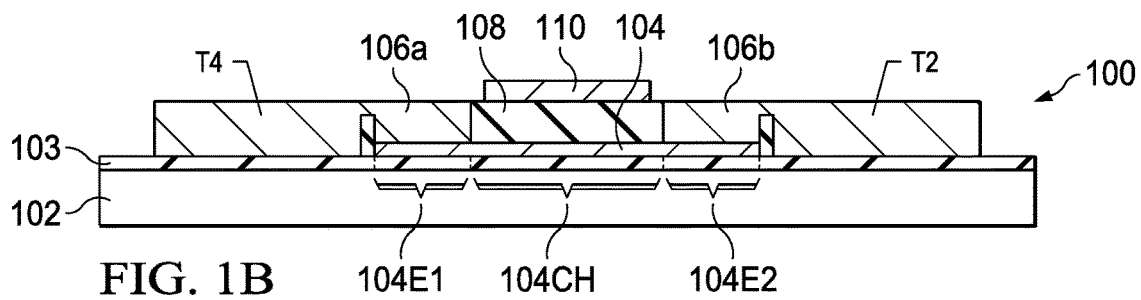
FIG. 1B is a cross-sectional schematic side view of the GHS shown in FIG. 1A taken along line 1B-1B.
Figure 1C:
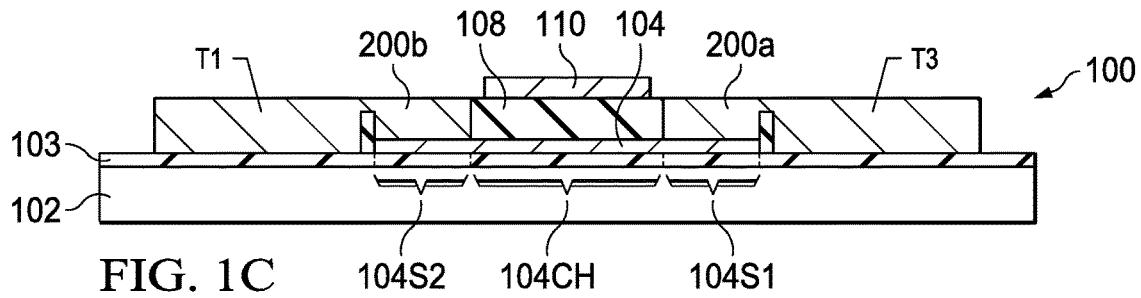
FIG. 1C is a cross-sectional schematic side view of the GHS shown in FIG. 1A taken along line 1C-1C.

FIGS. 1A-1C respectively show a schematic top view and cross-sectional schematic side views of a gate-controlled GHS 100. Specifically, FIG. 1B is a cross-sectional schematic side view of the GHS 100 shown in FIG. 1A taken along line 1B-1B. And FIG. 1C is a cross-sectional schematic side view of the GHS 100 shown in FIG. 1A taken along line 1C-1C. The GHS 100 includes a substrate 102 such as a dielectric (e.g., N-type Si), with a graphene layer 104 disposed and patterned on the substrate 102. An optional insulator 103 (comprising, for example, SiO$_2$) may be formed between the graphene layer 104 and the substrate 102.

As shown in FIG. 1A, in this example, the graphene layer 104 is formed as a symmetrical cross shape defining laterally spaced first and second excitation portions 104E1 and 104E2 (see FIG. 1B), along with vertically spaced first and second sense portions 104S1 and 104S2 (see FIG. 1C), as well as a central portion 104CH (see FIGS. 1B and 1C) referred to herein as a channel portion of the graphene layer 104. Different graphene layer shapes can be used in other examples. The sensor 100 includes first and second conductive excitation contact structures 106a and 106b, individually coupled with the corresponding excitation portions 104E1 and 104E2 of the graphene layer 104 for applying a bias voltage or bias current to the channel portion 104CH during operation of the GHS 100.

As better shown in FIG. 1B in this example, the excitation contact structures 106a and 106b are formed of copper or other suitable conductive material to provide ohmic contacts for biasing the channel portion 104CH. As shown in FIGS. 1B and 1C, a dielectric structure 108 (comprising, for example, Al$_2$O$_3$) is formed above the channel portion 104CH of the graphene layer 104, and a conductive gate structure 110 is formed above a portion of the dielectric structure 108 above the channel portion 104CH. The graphene layer 104 is under the contact structures 200b, 106b, 200a, 106a, not the pads T1-T4. In the channel portion of the device (not under the contact structures), the graphene layer 104 is positioned between insulator 103 and dielectric structure 108. In one form of operation, the gate structure 110 is operable to apply a gate voltage (V$_G$) for controlling the carrier concentration of the channel portion 104CH to adapt the magnetic field sensitivity of the GHS 100.

The GHS of FIGS. 1A-1C further includes first and second conductive sense contact structures 200a and 200b, respectively coupled with the corresponding first and second sense portions 104S1 and 104S2 of the graphene layer 104. The sense contact structures 200a and 200b (formed of copper or other suitable conductive material) form ohmic contacts in this example, and are operable to sense a Hall voltage of the channel portion 104CH for providing a signal representing a magnetic field proximate the sensor 100. The Hall sensor 100 is generally sensitive to magnetic fields normal to the plane of the graphene layer 104, thereby allowing use of the GHS 100 in current sensing, magnetometer or other applications in which an external magnetic field strength is to be sensed or detected.

FIGS. 1A-1C also show the first and second conductive excitation contact structures 106a and 106b electrically connected to pads/terminals T4 and T2, respectively. And the first and second conductive sense contact structures 200a and 200b are electrically connected to pads/terminals T3 and T1, respectively. Pads T1-T4 comprise a metal, such as Ni—Au, with a very low resistance, because they make contact with graphene which is sort of a semi-metal semiconductor.

It is noted that the GHS 100 functions similarly to the GHS disclosed in U.S. Pat. Nos. 10,069,065 and 10,001,529, both issued to Polley, et al. As such, the teachings in these patents are hereby incorporated by reference. These patents are directed to sensors and utilize graphene for high performance sensors rather than for amplification purposes. An aspect of this description uses similar principles but instead of sensing a magnetic field, a magnetic field is used as a bias field along with a similar structure for amplification of a small electrical voltage. Thus, essentially, an aspect of this description is to employ an amplifier using a hall effect sensor device where a magnetic field is used a bias that allows separate control using the gain.

FIGS. 1A-1C is a GHS structure which is similar to the GHS structures disclosed in the above patents. With reference to the cross-sectional views shown in FIGS. 1B and 1C, the graphene layer is represented as a thin line and, as well known, is a two-dimensional (one atomic layer thin) layer of material made of carbon. Once the graphene layer is formed, it may be cut into a general cross shape using a technique such as lithography. The cross shape includes crossed legs with a larger square at each end of the crossed legs. The larger squares are for connection to the contact structures 200b, 106b, 200a, 106a. The cross shape, including the crossed legs and larger squares, all reside in the two-dimensional layer.

FIGS. 1B and 1C show pads T1, T2, T3, T4 for the GHS. To enable a hall sensor to function, a bias voltage needs to be provided. Hence, a bias voltage is applied between pads T1 and T3. T3 is set to ground and a bias voltage is applied to T1.

Figure 2:
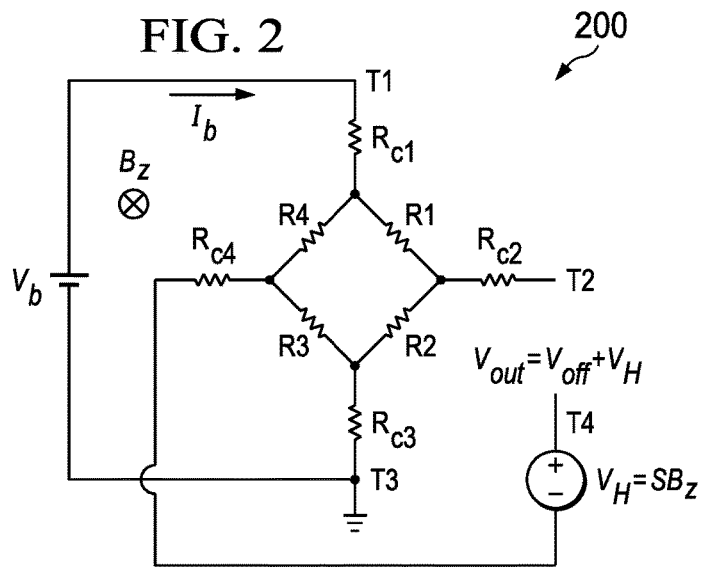
FIG. 2 is a circuit corresponding to functions of the GHS shown in FIG. 1A.

FIG. 2 illustrates a circuit 200 corresponding to functions of the GHS 100 shown in FIG. 1A. This GHS device works as a type of resistive network and can be represented as corresponding to a Wheatstone bridge network. In FIG. 2, resistances $R_{c1}$, $R_{c2}$, $R_{c3}$, $R_{c4}$ are included for the contact structures 200b, 106b, 200a, 106a, respectively, in FIG. 1A. Specifically, resistances $R_{c1}$, $R_{c2}$, $R_{c3}$, $R_{c4}$ represent the graphene-contact resistances of the small graphene overlap areas under the contact structures 200b, 106b, 200a, 106a, respectively (see FIGS. 1B and 1C). Resistances R1-R4 in FIG. 2 are disposed on 4-sides of a square and form a Wheatstone bridge. The Wheatstone bridge is a bulk model for the graphene layer cross shown in FIG. 1A. The Wheatstone bridge is a distributed resistive element but is modeled as bulk resistors. For example, using electrical modeling, R1 is the resistance for an element if placed between pads T1 and T2 while contacting the graphene layer.

The GHS works by putting a mag field $B_z$ (FIG. 2, assuming x-y is the plane of the GHS device) perpendicular to this plane (perpendicular to the GHS shown in FIG. 1A, coming from above or below). If x-y is the plane of the device, then the mag field is in the z-direction. Then a voltage $V_H$ is generated between T2 and T4. $V_H$ is the GHS voltage effect given by $SB_z$. Sensitivity S is linearly proportional to $V_H$. S=V/Tesla. Also, in FIG. 2, $V_b$ is the bias voltage for the sensor that is input separately from the magnetic field $B_z$. Unless you bias the sensor, the sensitivity S will be very low. Hence, it becomes necessary to apply the bias voltage $V_b$ to the sensor. It is noted that a bias current $I_b$ may alternatively be employed instead of the bias voltage $V_b$.

Gate voltage can be applied by putting a gate structure 110 above the dielectric structure 108. The result is a metal oxide and graphene structure. By changing the voltage of the metal (similar to a MOSFET) you can change the charge density in graphene, similar to what is done for silicon. But for graphene, the change can occur the entire way from electron to hole. Thus, in FIG. 3, the plot shows that as the gate voltage is changed from a negative voltage to a positive voltage, the charge density is changed from mostly hole-type to mostly electron-type. Also, if you have a zero-bias field, then sensitivity become essentially zero. Thus, the sensor needs to be biased. What is interesting about a GHS is that electron charge density $n_e$ and hole charge density $n_h$ can be changed by gate modulation.

With reference again to FIG. 3, the figure shows a plot 300 illustrating bias voltage-normalized sensitivity as a function of gate voltage, corresponding to operation of the GHS 100 shown in FIG. 1A. As is known, Hall sensitivity (S) is expressed by the following equation:

$$S = \frac{\partial V_H}{\partial B} \cong \frac{W}{L} \frac{\mu(n_h - n_e)}{\sqrt{(n_h + n_e)^2 + n_0^2}} V_{bias}$$

where:
$V_H$ is the Hall voltage;
B is the bias magnetic field;
W is the width of the excitation portions of the graphene layer;
L is the width of the graphene layer including both excitations portions;
µ is the mobility of the graphene layer;
$n_h$ is the hole charge density;
$n_e$ is the electron charge density;
$n_0$ is the residual charge density due to impurity (charge puddles); and
$V_{bias}$ is the bias voltage.

It is noted that since hole charge density $n_h$ and electron charge density $n_e$ are used, the device employs ambipolar conduction.

Figure 3:
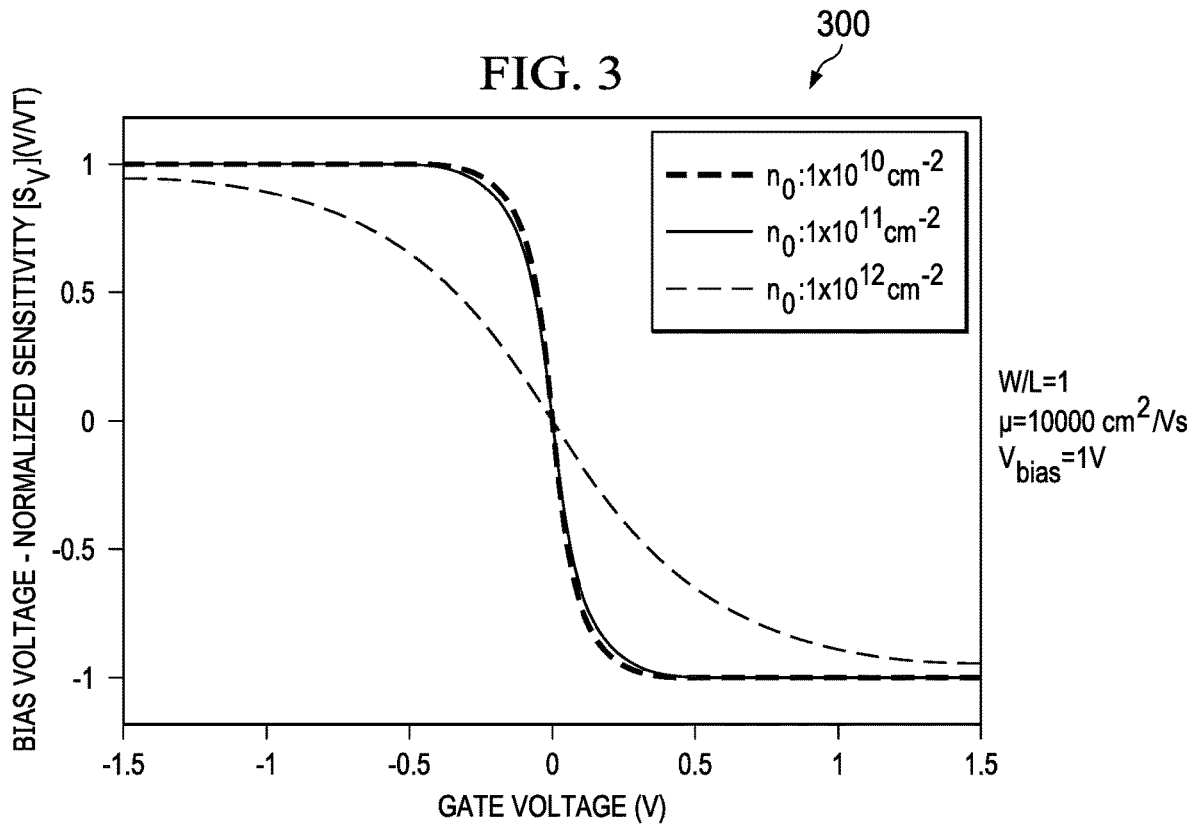
FIG. 3 is a plot illustrating bias voltage-normalized sensitivity as a function of gate voltage, corresponding to operation of the GHS shown in FIG. 1A.
Figure 4:
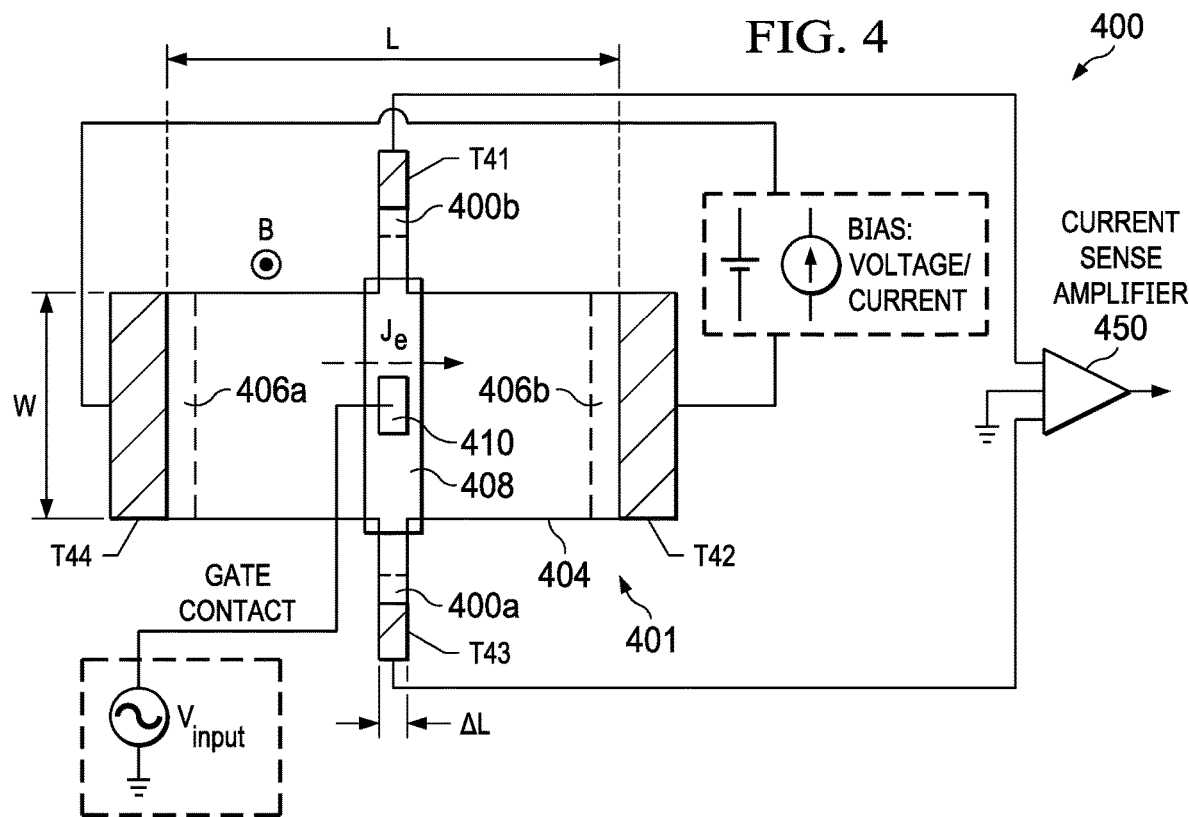
FIG. 4 is a diagram of an amplifier including a GHS and CSA, along with corresponding circuitry.
Figure 5:
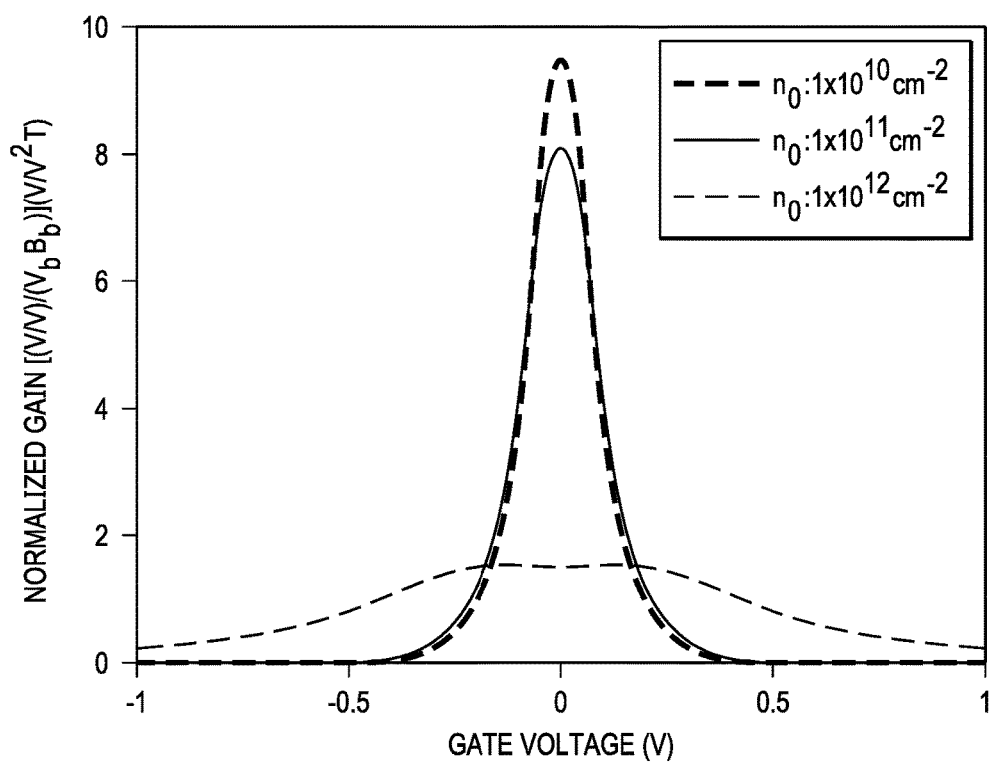
FIG. 5 is a plot illustrating normalized gain as a function of gate voltage, corresponding to operation of the amplifier shown in FIG. 4.

In an example, FIG. 4 shows a diagram of an amplifier 400 including a GHS 401 and CSA 450, along with corresponding circuitry. FIG. 5 shows a plot 500 illustrating normalized gain as a function of gate voltage, corresponding to operation of the amplifier 400 shown in FIG. 4. In both scenarios of FIGS. 1-3 and FIGS. 4-5, bias voltages are applied to the GHS devices. In FIGS. 1-3, the magnetic field is being sensed. Whereas, in FIGS. 4-5, the magnetic field is a constant and is desired to be large (for example, in the range of >0.1 Tesla) so that the output voltage is large, while the magnetic field essentially becomes a type of bias itself. The amplifier 400 may use a gate voltage-Hall output linear curve near Dirac voltage for amplification. Current density $J_e$ is also shown in FIG. 4.

With reference to FIG. 5, in an example, the input dynamic range is approximately $\pm V_T$. The maximum bias voltage is limited considering the Hall sensor band diagram in FIG. 5 and limits available gain as follows:

$$\Delta V < V_T$$
$$\Rightarrow \frac{V_{bias}}{L} \Delta L < V_T$$

where:
$V_T$ is the constant temperature voltage.

The corresponding output is current-sense and does not change the band diagram in FIG. 5.

If we change a very small sinusoidal gate voltage slightly (around 0 volt), then a huge change in sensitivity is achieved. If a strong DC bias mag field is applied on top of that, then the output voltage will exhibit a high swing for a very small swing in the gate voltage.

In other words, if one curve ($n_0$:1×10¹⁰ cm⁻²), for example, is considered, and if a very small gate voltage signal of around 0 volt is applied, then a very large change in sensitivity for a very small change in gate voltage is achieved.

An increase in the bias voltage and an increase in the magnetic field will add to the voltage swing, so a very large voltage swing is achieved for a very small voltage swing at the gate. Hence, efficient and large amplification is realized. For the largest amplification factor, the slope of the curve around zero has the greatest amplification effect. The slope is proportionally related to amplification factor. And the magnetic field will be proportional to the amplification factor.

The amplifier 400 in FIG. 4 includes GHS 401 which is similar to the GHS 100 shown in FIG. 1A, although the GHS 401 is asymmetrical. The bias current flow direction in the excitation direction is wider compared to the sense direction. The bias current direction is horizontal. FIG. 4 shows the GHS's contact structures 400a, 400b as being smaller, as compared to the relatively larger size contact structures 406a, 406b. Correspondingly, the graphene layer 404 in between is narrower towards the contact structures 400a, 400b and wider towards the contact structures 406a, 406b. Pads/terminals T41-T44 are correspondingly sized with respect to contact structures 400b, 406b, 400a, 406a, respectively. The cross-sections of the GHS 401 structure are similar to those shown in FIGS. 1B and 1C, except for accommodation of the above-mentioned differences in size/shape in the contact structures 400b, 406b, 400a, 406a, pads T41-T44, and graphene layer 404, as well as the different size/shape of the dielectric structure 408. The GHS 401 amplifies the gate input voltage ($V_{input}$) which is a small AC gate voltage applied to the conductive gate structure 410. A bias voltage and/or bias current is/are also used. Since a hall effect function is desired, a mag field is also employed. A CSA 450 is also employed and will have an input impedance that will be very low (in the range of, for example, <100 Ohm).

The gate voltage for the sensors in the above patents and in FIGS. 1A-1C is used to reduce the noise and reduce the offset of the GHS. The gate voltage is a controlled parameter used to improve the sensor as the sensor is sensing the magnetic field. The object was to sense the magnetic field. If the magnetic field is zero, than the output would be zero. If the magnetic field is 1 Tesla, then the output would be proportional to that amount. Therefore the gate voltage is used for a different purpose than in the example of the amplifier 400 in FIG. 4. In FIG. 4, the gate voltage is not a controlled parameter. Small changes in the gate voltage is what is being sensed and amplified, and the magnetic field is just a bias magnetic field to increase that amplification. The magnetic field is kept constant so that the amplification factor is constant. Amplification of even a small elliptical signal is therefore achieved.

In an example, the amplifier 400 exhibits features and relationships expressed by the following equations:
Gate Capacitance Vs. Quantum Capacitance:

$$Q_{oxide} = -Q_{graphene} \Rightarrow C_{ox}(V_G - E_F/q) = -q(n_h(E_F, T) - (E_F, T))$$

where:
$Q_{oxide}$ is charge in gate metal;
$Q_{graphene}$ is charge induced in the graphene layer;
$C_{OX}$ is the capacitance of the dielectric structure 408 (oxide layer), i.e., the gate capacitance;

$V_G$ is the gate voltage;
q is the electron charge;
$E_F$ is the Fermi energy level in the graphene layer; and
T is the temperature in Kelvin unit.
Approximate Equation for Quantum Capacitance $C_Q$:

$$C_Q \sim \frac{2e^2 kT}{\pi h^2 v_F^2} \log(5) = 9.8 \times 10^{-3} F/m^2 \left(\frac{T}{300}\right)$$

where:
e is electronic charge;
k is Boltzmann constant;
h is Planck's constant;
$v_F$ is Fermi velocity of graphene;
F is Farad; and
m is meter.
Sensitivity ($S_V$) Approximate Equation:

$$S_V = \frac{\mu W}{L} \frac{C_R V_G}{\sqrt{(qn_0)^2 + (C_Q V_T)^2 + (C_R V_G)^2}}$$

where:
$C_R$ is the effective series capacitance of oxide and quantum capacitance;
$C_Q$ is the quantum capacitance of the graphene layer;
$C_Q V_T$ relates to thermal spreading; and
q is the electron charge.
Hall Voltage $V_H$ signal:

$$V_H = \frac{\mu W}{L} \frac{C_R V_G}{\sqrt{(qn_0)^2 + (C_Q V_T)^2 + (C_R V_G)^2}} V_b B$$

where:
$V_b$ is the bias voltage.
Approximate equation for amplification (amplification factor $A_V$):

$$A_V = \frac{\partial V_H}{\partial V_G}\bigg|_{V_G=0} = \frac{\mu W C_R B V_{bias}}{L\sqrt{(qn_0)^2 + (C_Q V_T)^2}}$$

$$C_R = C_Q C_{OX}(C_Q + C_{OX})$$

where:
$C_R$ is the effective series capacitance of oxide and quantum capacitance;
$C_Q$ is the quantum capacitance of the graphene layer 404;
$C_{OX}$ is the capacitance of the dielectric structure 408 (oxide layer)
Thus, with an increase in either voltage bias $V_{bias}$ and/or bias magnetic field B, the amplification factor increases.
Amplification limit (amplification factor $A_V$):

$$A_V < \frac{\mu W C_R B V_T}{\Delta L \sqrt{(qn_0)^2 + (C_Q V_T)^2}}$$

Output resistance $R_{out}$:

$$R_{out} = \frac{W}{\sigma \Delta L} = \frac{W}{\Delta L \mu \sqrt{(qn_0)^2 + (C_Q V_T)^2}}$$

Since a CSA 450 is employed along with the GHS 401 in amplifier 400, there is a conversion of voltage to current. The amplifier 400 is, therefore, considered a type of transconductor and its corresponding transconductance limit $G_m$ is expressed by the following equation:

$$G_m = \frac{A_V}{R_{out}} < \mu^2 C_R B V_T$$

As can be seen from this equation, a very large transconductance in the range of 0.1-100 mSiemens using the amplifier 400 can be achieved by increasing the bias magnetic field and/or improving the mobility of graphene layer 404, resulting in improved performance. The control parameters for the amplifier 400 are: mobility and bias magnetic field. Thus, the amplifier 400 achieves separate control for amplification that is independent of device geometry. Using a larger bias magnetic field and/or bias voltage $V_{bias}$, the amplifier 400 will achieve more gain. With $V_{bias}$ fixed, B can be constant and larger resulting in increased gain. Given the amplification is of the gate voltage, small changes in the gate voltage will be amplified as a large change in the output, and works best with a small range of gate voltage signals, thereby achieving larger amplified output.

With reference to FIG. 4, in at least one example, an amplifier includes a GHS. The GHS includes a graphene layer formed above a substrate, a dielectric structure formed above a channel portion of the graphene layer, and a conductive gate structure formed above at least a portion of the dielectric structure above the channel portion of the graphene layer for applying a gate voltage. The GHS also includes first and second conductive excitation contact structures coupled with corresponding first and second excitation portions of the graphene layer for applying at least one of the following to the channel portion of the graphene layer: a bias voltage; and a bias current. The GHS further includes first and second conductive sense contact structures coupled with corresponding first and second sense portions of the graphene layer. The amplifier also includes a CSA coupled to the GHS. The CSA senses current output from the GHS. An output of the CSA corresponds to an amplification of the applied gate voltage.

The amplifier may further comprise a bias magnetic field source for applying a bias magnetic field to the GHS. The bias magnetic field is a constant bias magnetic field such that an amplification factor corresponding to the amplification of the applied gate voltage is constant.

In an example, an amplification based on the applied gate voltage and the CSA output that results using the amplifier is expressed by the following equation:

$$A_V = \frac{\mu W C_R B V_{bias}}{L\sqrt{(qn_0)^2 + (C_Q V_T)^2}}$$

where:
$A_v$ is the amplification limit;
μ is the mobility of the graphene layer;
W is the width of the excitation portions of the graphene layer;
L is the width of the graphene layer including both excitations portions;
$C_R$ is the series capacitance;
B is the bias magnetic field;
$V_{bias}$ is the bias voltage;
q is the electron charge;
$n_o$ is the residual charge density;
$C_Q$ is the quantum capacitance; and
$V_T$ is the constant temperature voltage.

In an example, a transconductance based on a conversion of the applied gate voltage to the CSA output that results using the amplifier is expressed by the following equation:

$$G_m = \frac{A_V}{R_{out}} < \mu^2 C_R B V_T$$

where:
$G_m$ is the maximum transconductance limit;
$A_v$ is the amplification limit;
$R_{out}$ is the output resistance;
μ is the mobility of the graphene layer;
$C_R$ is the series capacitance;
B is the bias magnetic field; and
$V_T$ is the constant temperature voltage.

In an example, the CSA is coupled to the GHS via the first and second conductive sense contact structures. The first and second conductive sense contact structures and the corresponding first and second sense portions of the graphene layer may each be smaller than the first and second conductive excitation contact structures and the corresponding first and second excitation portions of the graphene layer.

With reference again to FIG. 4, in another example, a method includes employing a GHS. The GHS includes a graphene layer formed above a substrate, a dielectric structure formed above a channel portion of the graphene layer, and a conductive gate structure formed above at least a portion of the dielectric structure above the channel portion of the graphene layer. The GHS also includes first and second conductive excitation contact structures coupled with corresponding first and second excitation portions of the graphene layer. The GHS further includes first and second conductive sense contact structures coupled with corresponding first and second sense portions of the graphene layer. The method also includes applying a gate voltage to the conductive gate structure, applying at least one of a bias voltage and a bias current to the channel portion of the graphene layer via the first and second conductive excitation contact structures, and sensing current output from the GHS using a CSA coupled to the GHS. An output of the CSA corresponds to an amplification of the applied gate voltage.

The method may further comprise applying a bias magnetic field to the GHS, and may yet further comprise holding the bias magnetic field constant such that an amplification factor corresponding to the amplification of the applied gate voltage is constant.

In an example, an amplification based on the applied gate voltage and the CSA output that results using the employing step, the applying steps, and the sensing step is expressed by the following equation:

$$A_V = \frac{\mu W C_R B V_{bias}}{L\sqrt{(qn_0)^2 + (C_Q V_T)^2}}$$

where:
$A_v$ is the amplification limit;
μ is the mobility of the graphene layer;
W is the width of the excitation portions of the graphene layer;
L is the width of the graphene layer including both excitations portions;
$C_R$ is the series capacitance;
B is the bias magnetic field;
$V_{bias}$ is the bias voltage;
q is the electron charge;
$n_o$ is the residual charge density;
$C_Q$ is the quantum capacitance; and
$V_T$ is the constant temperature voltage.

In an example, a transconductance based on a conversion of the applied gate voltage to the CSA output that results using the employing step, the applying steps, and the sensing step is expressed by the following equation:

$$G_m = \frac{A_V}{R_{out}} < \mu^2 C_R B V_T$$

where:
$G_m$ is the maximum transconductance limit;
$A_v$ is the amplification limit;
$R_{out}$ is the output resistance;
μ is the mobility of the graphene layer;
$C_R$ is the series capacitance;
B is the bias magnetic field; and
$V_T$ is the constant temperature voltage.

In an example, the CSA is coupled to the GHS via the first and second conductive sense contact structures. The first and second conductive sense contact structures and the corresponding first and second sense portions of the graphene layer may each be smaller than the first and second conductive excitation contact structures and the corresponding first and second excitation portions of the graphene layer.

With reference again to FIG. 4, in yet another example, a method includes applying a gate voltage to a conductive gate structure of a GHS. The GHS includes a graphene layer and a dielectric structure formed above a channel portion of the graphene layer. The conductive gate structure is formed above at least a portion of the dielectric structure above the channel portion of the graphene layer. The GHS also includes first and second conductive excitation contact structures coupled with corresponding first and second excitation portions of the graphene layer. The GHS further includes first and second conductive sense contact structures coupled with corresponding first and second sense portions of the graphene layer. The method also includes applying at least one of a bias voltage and a bias current to the channel portion of the graphene layer via the first and second conductive excitation contact structures, applying a bias magnetic field to the GHS, and sensing current output from the GHS using a CSA coupled to the GHS, wherein an output of the CSA corresponds to an amplification of the applied gate voltage.

The method may further comprise holding the bias magnetic field constant such that an amplification factor corresponding to the amplification of the applied gate voltage is constant.

In an example, an amplification based on the applied gate voltage and the CSA output that results using the employing step, the applying steps, and the sensing step is expressed by the following equation:

$$A_V = \frac{\mu W C_R B V_{bias}}{L\sqrt{(qn_0)^2 + (C_Q V_T)^2}}$$

where:
$A_v$ is the amplification limit;
$\mu$ is the mobility of the graphene layer;
W is the width of the excitation portions of the graphene layer;
L is the width of the graphene layer including both excitations portions;
$C_R$ is the series capacitance;
B is the bias magnetic field;
$V_{bias}$ is the bias voltage;
q is the electron charge;
$n_o$ is the residual charge density;
$C_Q$ is the quantum capacitance; and
$V_T$ is the constant temperature voltage.

In an example, a transconductance based on a conversion of the applied gate voltage to the CSA output that results using the employing step, the applying steps, and the sensing step is expressed by the following equation:

$$G_m = \frac{A_V}{R_{out}} < \mu^2 C_R B V_T$$

where:
$G_m$ is the maximum transconductance limit;
$A_v$ is the amplification limit;
$R_{out}$ is the output resistance;
$\mu$ is the mobility of the graphene layer;
$C_R$ is the series capacitance;
B is the bias magnetic field; and
$V_T$ is the constant temperature voltage.

In an example, the CSA is coupled to the GHS via the first and second conductive sense contact structures. The first and second conductive sense contact structures and the corresponding first and second sense portions of the graphene layer may each be smaller than the first and second conductive excitation contact structures and the corresponding first and second excitation portions of the graphene layer.

As described in the examples above, the capability of ambipolar conduction in graphene by controlling the gate voltage is an important aspect of this description, and enables a separate control for amplification gain proportional to the magnetic bias field.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An amplifier, comprising:
a graphene Hall sensor (GHS), wherein the GHS comprises:
a graphene layer formed above a substrate;
a dielectric structure formed above a channel portion of the graphene layer;
a conductive gate structure formed above at least a portion of the dielectric structure above the channel portion of the graphene layer for applying a gate voltage;
first and second conductive excitation contact structures coupled with corresponding first and second excitation portions of the graphene layer for applying at least one of the following to the channel portion of the graphene layer: a bias voltage; and a bias current; and
first and second conductive sense contact structures coupled with corresponding first and second sense portions of the graphene layer;
a current sense amplifier (CSA) coupled to the GHS, wherein the CSA senses current output from the GHS, and wherein an output of the CSA corresponds to an amplification of the applied gate voltage; and
a bias magnetic source for applying a bias magnetic field to the GHS;
wherein an amplification based on the applied gate voltage and the CSA output that results using the amplifier is expressed by the following equation:

$$A_V = \frac{\mu W C_R B V_{bias}}{L\sqrt{(qn_0)^2 + (C_Q V_T)^2}}$$

where:
$A_v$ is the amplification limit;
$\mu$ is the mobility of the graphene layer;
W is the width of the excitation portions of the graphene layer;
L is the width of the graphene layer including both excitations portions;
$C_R$ is the series capacitance;
B is the bias magnetic field;
$V_{bias}$ is the bias voltage;
q is the electron charge;
$n_o$ is the residual charge density;
$C_Q$ is the quantum capacitance; and
$V_T$ is the constant temperature voltage.

2. The amplifier of claim 1, wherein the bias magnetic field is a constant bias magnetic field such that an amplification factor corresponding to the amplification of the applied gate voltage is constant.

3. The amplifier of claim 1, wherein the CSA is coupled to the GHS via the first and second conductive sense contact structures.

4. The amplifier of claim 1, wherein the first and second conductive sense contact structures and the corresponding first and second sense portions of the graphene layer are each smaller than the first and second conductive excitation contact structures and the corresponding first and second excitation portions of the graphene layer.

5. An amplifier, comprising:
a graphene Hall sensor (GHS), wherein the GHS comprises:
  a graphene layer formed above a substrate;
  a dielectric structure formed above a channel portion of the graphene layer;
  a conductive gate structure formed above at least a portion of the dielectric structure above the channel portion of the graphene layer for applying a gate voltage;
  first and second conductive excitation contact structures coupled with corresponding first and second excitation portions of the graphene layer for applying at least one of the following to the channel portion of the graphene layer: a bias voltage; and a bias current; and
  first and second conductive sense contact structures coupled with corresponding first and second sense portions of the graphene layer;
a current sense amplifier (CSA) coupled to the GHS, wherein the CSA senses current output from the GHS, and wherein an output of the CSA corresponds to an amplification of the applied gate voltage; and
a bias magnetic source for applying a bias magnetic field to the GHS;
wherein a transconductance based on a conversion of the applied gate voltage to the CSA output that results using the amplifier is expressed by the following equation:

$$G_m = \frac{A_V}{R_{out}} < \mu^2 C_R B V_T$$

where:
$G_m$ is the maximum transconductance limit;
$A_v$ is the amplification limit;
$R_{out}$ is the output resistance;
$\mu$ is the mobility of the graphene layer;
$C_R$ is the series capacitance;
B is the bias magnetic field; and
$V_T$ is the constant temperature voltage.

6. A method, comprising:
employing a graphene Hall sensor (GHS), wherein the GHS comprises:
  a graphene layer formed above a substrate;
  a dielectric structure formed above a channel portion of the graphene layer;
  a conductive gate structure formed above at least a portion of the dielectric structure above the channel portion of the graphene layer;
  first and second conductive excitation contact structures coupled with corresponding first and second excitation portions of the graphene layer; and
  first and second conductive sense contact structures coupled with corresponding first and second sense portions of the graphene layer;
applying a gate voltage to the conductive gate structure;
applying at least one of a bias voltage and a bias current to the channel portion of the graphene layer via the first and second conductive excitation contact structures; and
sensing current output from the GHS using a current sense amplifier (CSA) coupled to the GHS, wherein an output of the CSA corresponds to an amplification of the applied gate voltage; and
applying a bias magnetic field to the GHS;
wherein an amplification based on the applied gate voltage and the CSA output that results using the employing step, the applying steps, and the sensing step is expressed by the following equation:

$$A_V = \frac{\mu W C_R B V_{bias}}{L\sqrt{(qn_0)^2 + (C_Q V_T)^2}}$$

where:
$A_v$ is the amplification limit;
$\mu$ is the mobility of the graphene layer;
W is the width of the excitation portions of the graphene layer;
L is the width of the graphene layer including both excitations portions;
$C_R$ is the series capacitance;
B is the bias magnetic field;
$V_{bias}$ is the bias voltage;
q is the electron charge;
$n_o$ is the residual charge density;
$C_Q$ is the quantum capacitance; and
$V_T$ is the constant temperature voltage.

7. The method of claim 6, wherein the method further comprises holding the bias magnetic field constant such that an amplification factor corresponding to the amplification of the applied gate voltage is constant.

8. The method of claim 6, wherein the CSA is coupled to the GHS via the first and second conductive sense contact structures.

9. The method of claim 6, wherein the first and second conductive sense contact structures and the corresponding first and second sense portions of the graphene layer are each smaller than the first and second conductive excitation contact structures and the corresponding first and second excitation portions of the graphene layer.

10. The method of claim 9, A method, comprising:
employing a graphene Hall sensor (GHS), wherein the GHS comprises:
  a graphene layer formed above a substrate;
  a dielectric structure formed above a channel portion of the graphene layer;
  a conductive gate structure formed above at least a portion of the dielectric structure above the channel portion of the graphene layer;
  first and second conductive excitation contact structures coupled with corresponding first and second excitation portions of the graphene layer; and
  first and second conductive sense contact structures coupled with corresponding first and second sense portions of the graphene layer;
applying a gate voltage to the conductive gate structure;
applying at least one of a bias voltage and a bias current to the channel portion of the graphene layer via the first and second conductive excitation contact structures; and
sensing current output from the GHS using a current sense amplifier (CSA) coupled to the GHS, wherein an output of the CSA corresponds to an amplification of the applied gate voltage; and applying a bias magnetic field to the GHS;
wherein a transconductance based on a conversion of the applied gate voltage to the CSA output that results using the employing step, the applying steps, and the sensing step is expressed by the following equation:

$$G_m = \frac{A_V}{R_{out}} < \mu^2 C_R B V_T$$

where:
$G_m$ is the maximum transconductance limit;
$A_v$ is the amplification limit;
$R_{out}$ is the output resistance;
µ is the mobility of the graphene layer;
$C_R$ is the series capacitance;
B is the bias magnetic field; and
$V_T$ is the constant temperature voltage.

11. A method, comprising:
applying a gate voltage to a conductive gate structure of a graphene Hall sensor (GHS), wherein the GHS comprises:
a graphene layer;
a dielectric structure formed above a channel portion of the graphene layer, wherein the conductive gate structure is formed above at least a portion of the dielectric structure above the channel portion of the graphene layer;
first and second conductive excitation contact structures coupled with corresponding first and second excitation portions of the graphene layer; and
first and second conductive sense contact structures coupled with corresponding first and second sense portions of the graphene layer;
applying at least one of a bias voltage and a bias current to the channel portion of the graphene layer via the first and second conductive excitation contact structures;
applying a bias magnetic field to the GHS; and
sensing current output from the GHS using a current sense amplifier (CSA) coupled to the GHS, wherein an output of the CSA corresponds to an amplification of the applied gate voltage;
wherein an amplification based on the applied gate voltage and the CSA output that results using the employing step, the applying steps, and the sensing step is expressed by the following equation:

$$A_V = \frac{\mu W C_R B V_{bias}}{L\sqrt{(q n_0)^2 + (C_Q V_T)^2}}$$

where:
$A_v$ is the amplification limit;
µ is the mobility of the graphene layer;
W is the width of the excitation portions of the graphene layer;
L is the width of the graphene layer including both excitations portions;
$C_R$ is the series capacitance;
B is the bias magnetic field;

$V_{bias}$ is the bias voltage;
q is the electron charge;
$n_o$ is the residual charge density;
$C_Q$ is the quantum capacitance; and
$V_T$ is the constant temperature voltage.

12. The method of claim 11, wherein the method further comprises holding the bias magnetic field constant such that an amplification factor corresponding to the amplification of the applied gate voltage is constant.

13. The method of claim 11, wherein the CSA is coupled to the GHS via the first and second conductive sense contact structures.

14. The method of claim 11, wherein the first and second conductive sense contact structures and the corresponding first and second sense portions of the graphene layer are each smaller than the first and second conductive excitation contact structures and the corresponding first and second excitation portions of the graphene layer.

15. A method, comprising:
applying a gate voltage to a conductive gate structure of a graphene Hall sensor (GHS), wherein the GHS comprises:
a graphene layer;
a dielectric structure formed above a channel portion of the graphene layer, wherein the conductive gate structure is formed above at least a portion of the dielectric structure above the channel portion of the graphene layer;
first and second conductive excitation contact structures coupled with corresponding first and second excitation portions of the graphene layer; and
first and second conductive sense contact structures coupled with corresponding first and second sense portions of the graphene layer;
applying at least one of a bias voltage and a bias current to the channel portion of the graphene layer via the first and second conductive excitation contact structures;
applying a bias magnetic field to the GHS; and
sensing current output from the GHS using a current sense amplifier (CSA) coupled to the GHS, wherein an output of the CSA corresponds to an amplification of the applied gate voltage;
wherein a transconductance based on a conversion of the applied gate voltage to the CSA output that results using the employing step, the applying steps, and the sensing step is expressed by the following equation:

$$G_m = \frac{A_V}{R_{out}} < \mu^2 C_R B V_T$$

where:
$G_m$ is the maximum transconductance limit;
$A_v$ is the amplification limit;
$R_{out}$ is the output resistance;
µ is the mobility of the graphene layer;
$C_R$ is the series capacitance;
B is the bias magnetic field; and
$V_T$ is the constant temperature voltage.

* * * * *